(12) United States Patent
Engl et al.

(10) Patent No.: US 8,866,175 B2
(45) Date of Patent: Oct. 21, 2014

(54) OPTOELECTRONIC SEMICONDUCTOR CHIP

(75) Inventors: Karl Engl, Pentling (DE); Markus Maute, Alteglofshiem (DE); Andreas Weimar, Regensburg (DE); Lutz Hoeppel, Alteglofsheim (DE); Patrick Rode, Regensburg (DE); Juergen Moosburger, Regensburg (DE); Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/821,554

(22) PCT Filed: Aug. 22, 2011

(86) PCT No.: PCT/EP2011/064386
§ 371 (c)(1),
(2), (4) Date: May 23, 2013

(87) PCT Pub. No.: WO2012/034828
PCT Pub. Date: Mar. 22, 2012

(65) Prior Publication Data
US 2013/0228819 A1  Sep. 5, 2013

(30) Foreign Application Priority Data

Sep. 17, 2010 (DE) .......... 10 2010 045 784

(51) Int. Cl.
*H01L 33/00* (2010.01)
*H01L 33/62* (2010.01)
*H01L 33/38* (2010.01)
*H01L 33/40* (2010.01)
*H01L 33/44* (2010.01)
*H01L 33/22* (2010.01)
*H01L 33/20* (2010.01)

(52) U.S. Cl.
CPC ......... *H01L 33/62* (2013.01); *H01L 2924/0002* (2013.01); *H01L 33/382* (2013.01); *H01L 33/405* (2013.01); *H01L 33/44* (2013.01); *H01L 33/22* (2013.01); *H01L 33/20* (2013.01)
USPC ............................... 257/98; 257/99; 257/100

(58) Field of Classification Search
USPC .................................................... 257/98–100
See application file for complete search history.

(56) References Cited

U.S. PATENT DOCUMENTS 7,964,881 B2  6/2011 Choi et al.
2010/0096652 A1  4/2010 Choi et al.
(Continued)

FOREIGN PATENT DOCUMENTS

DE  101 47 886 A1  4/2003
DE  10 2007 022 947 A1  10/2008
(Continued)

*Primary Examiner* — Samuel Gebremariam
(74) *Attorney, Agent, or Firm* — Slater & Matsil, L.L.P.

(57) ABSTRACT

An optoelectronic semiconductor chip includes a semiconductor layer sequence and a carrier substrate. A first and a second electrical contact layer are arranged at least in regions between the carrier substrate and the semiconductor layer sequence and are electrically insulated from one another by an electrically insulating layer. A mirror layer is arranged between the semiconductor layer sequence and the carrier substrate. The mirror layer adjoins partial regions of the first electrical contact layer and partial regions of the electrically insulating layer. The partial regions of the electrically insulating layer which adjoin the mirror layer are covered by the second electrical contact layer in such a way that at no point do they adjoin a surrounding medium of the optoelectronic semiconductor chip.

16 Claims, 17 Drawing Sheets

(56) References Cited

U.S. PATENT DOCUMENTS

2010/0171135 A1    7/2010   Engl et al.
2012/0007118 A1*   1/2012   Choi et al. .................. 257/98

FOREIGN PATENT DOCUMENTS

| | | |
|---|---|---|
| DE | 10 2008 011 848 A1 | 9/2009 |
| DE | 10 2009 030 243 A1 | 5/2010 |
| DE | 10 2009 010 480 A1 | 9/2010 |
| EP | 1 168 460 A2 | 1/2002 |
| JP | 2003243705 A | 8/2003 |
| JP | 2006120913 A | 5/2006 |
| JP | 2009105376 A | 5/2009 |
| JP | 2011517064 A | 5/2011 |
| JP | 2012505531 A | 3/2012 |
| KR | 100891761 B1 | 4/2009 |
| KR | 20100002487 A | 1/2010 |
| WO | 2006043422 A1 | 4/2006 |
| WO | WO 2008/131743 A1 | 11/2008 |
| WO | WO 2009/106069 A1 | 9/2009 |

* cited by examiner

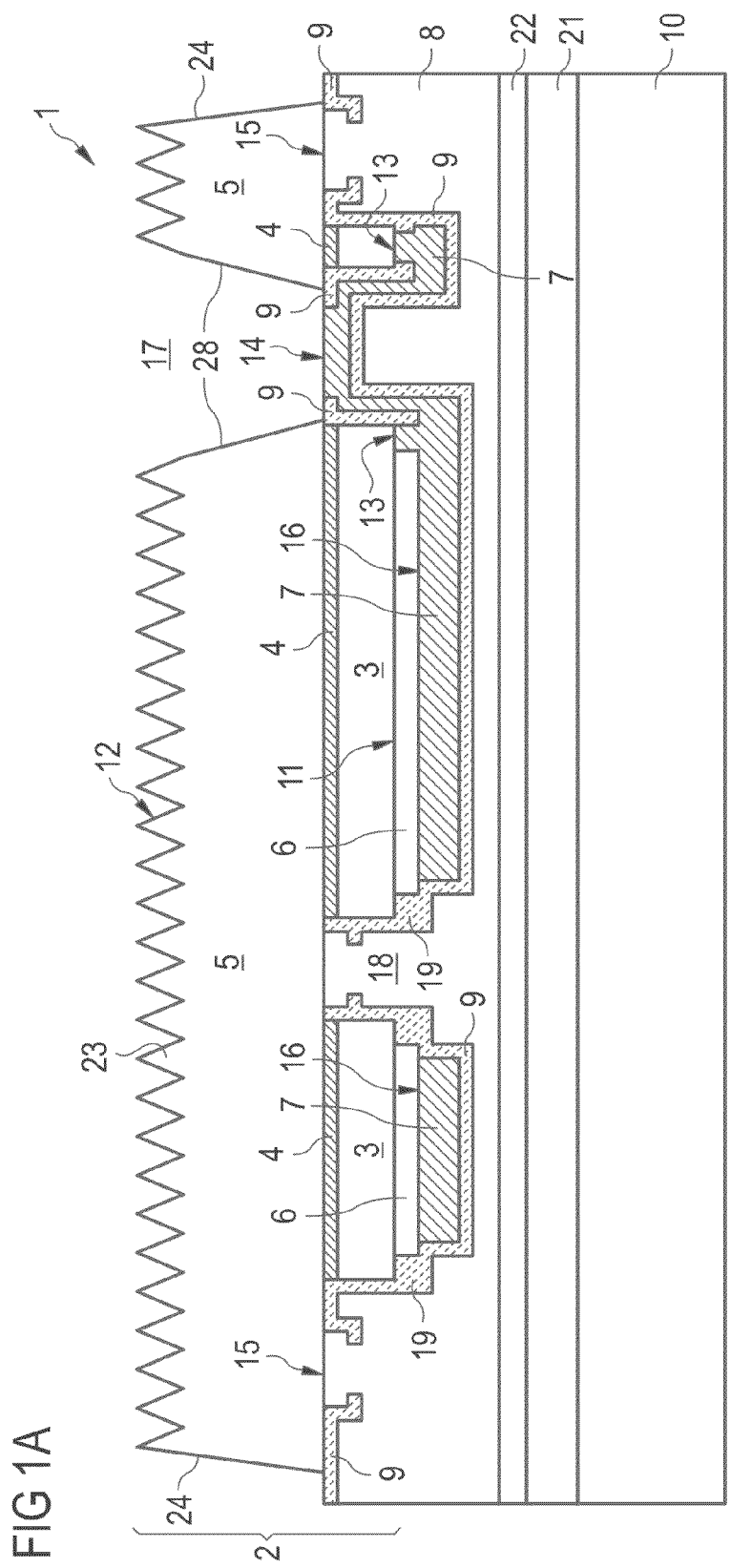

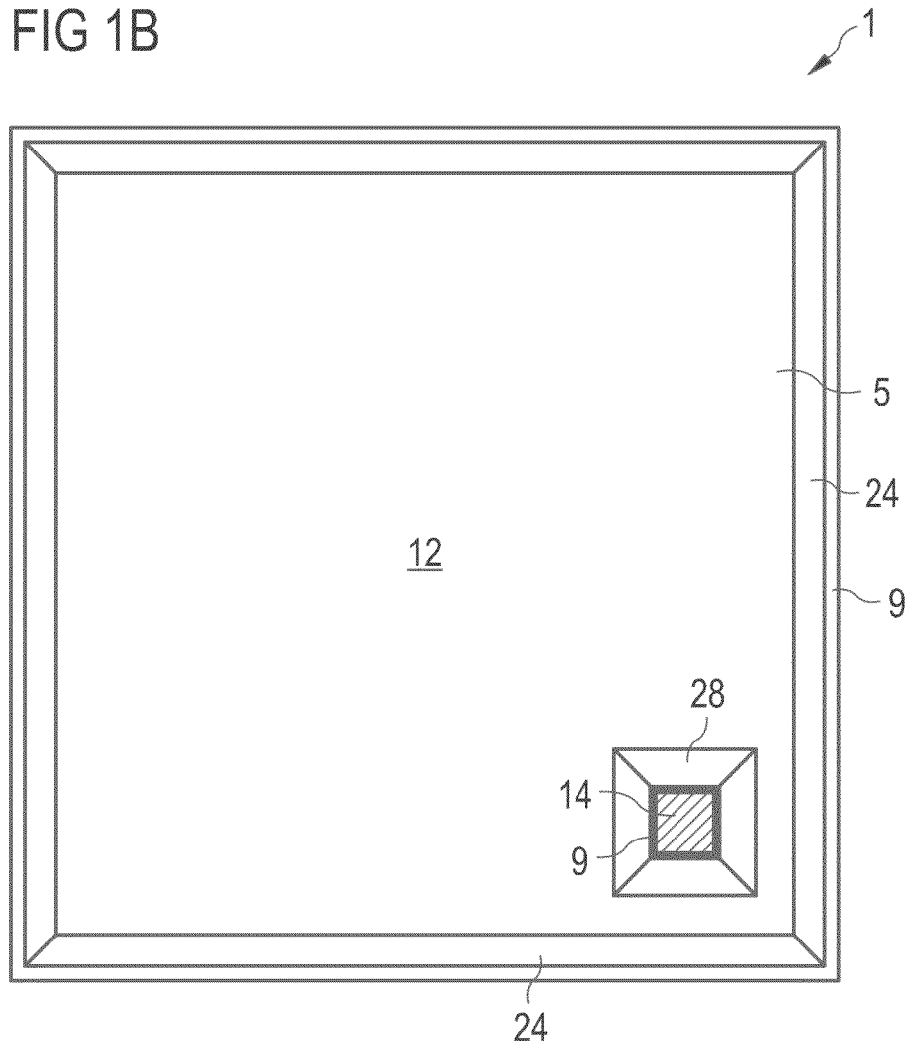

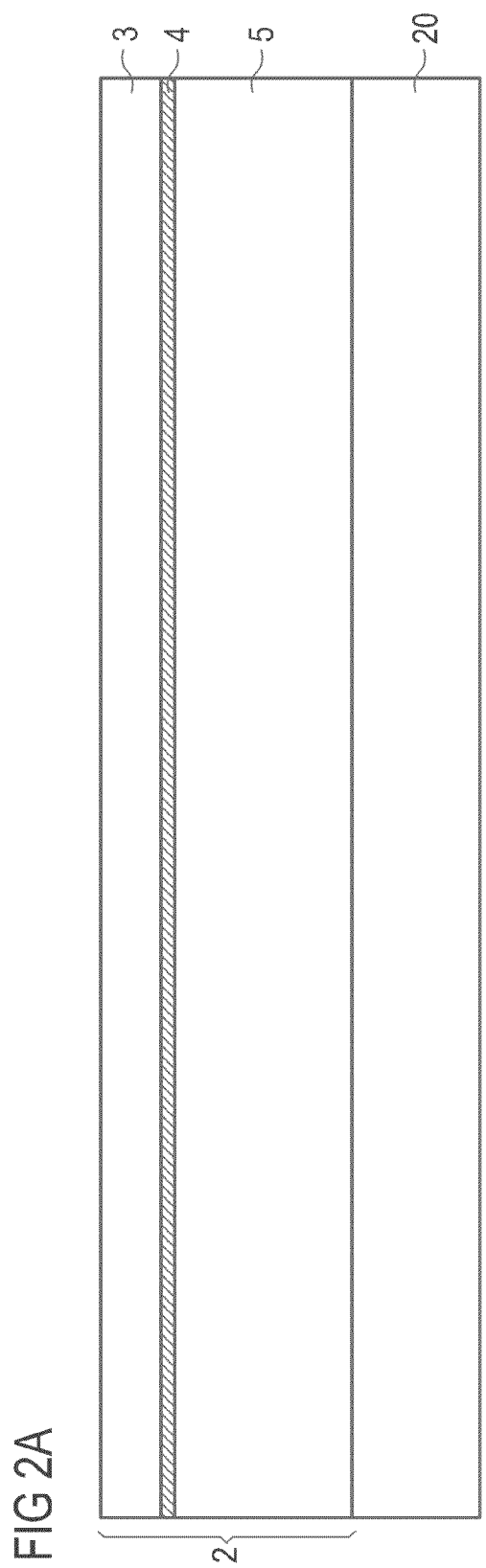

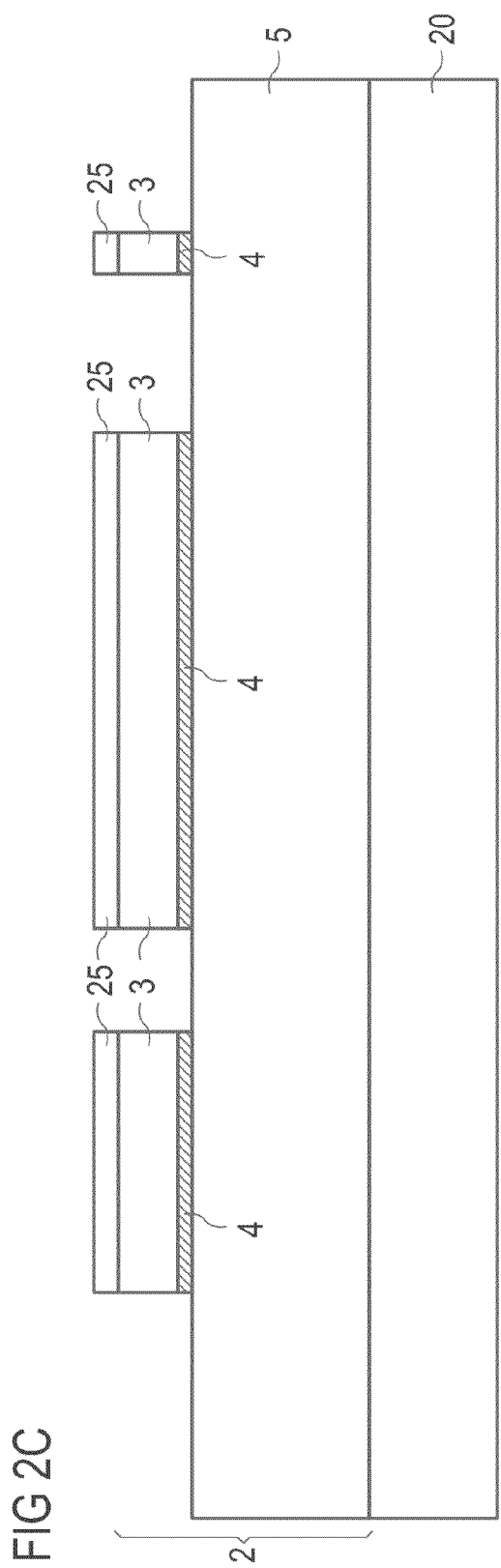

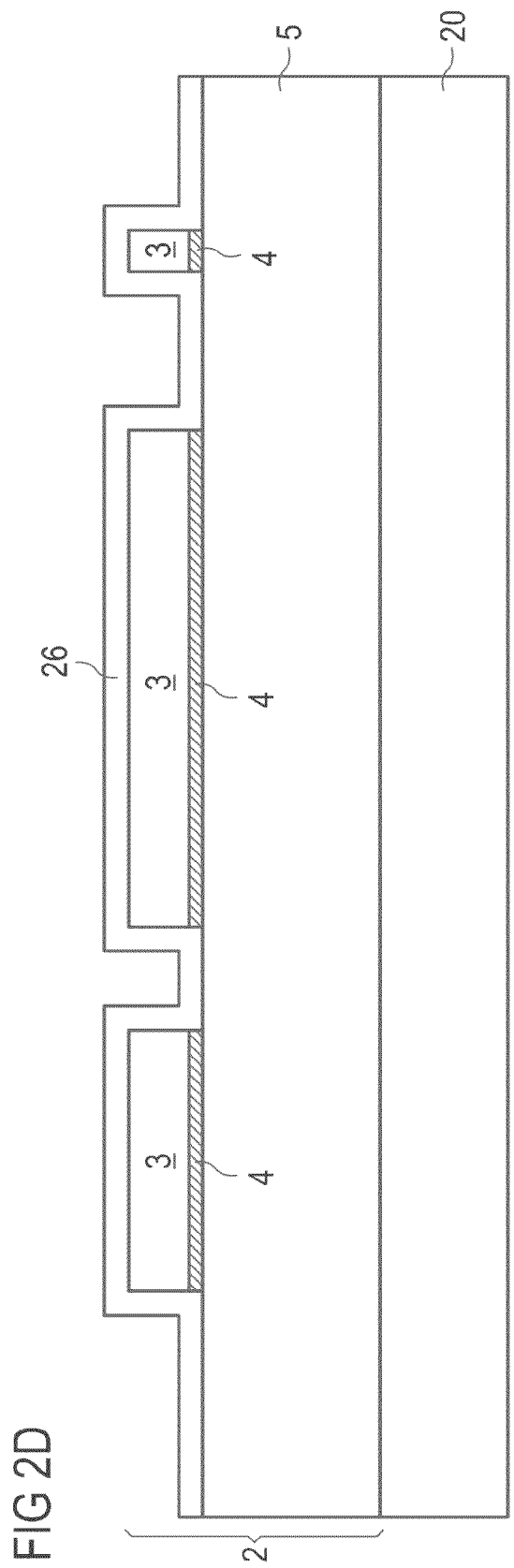

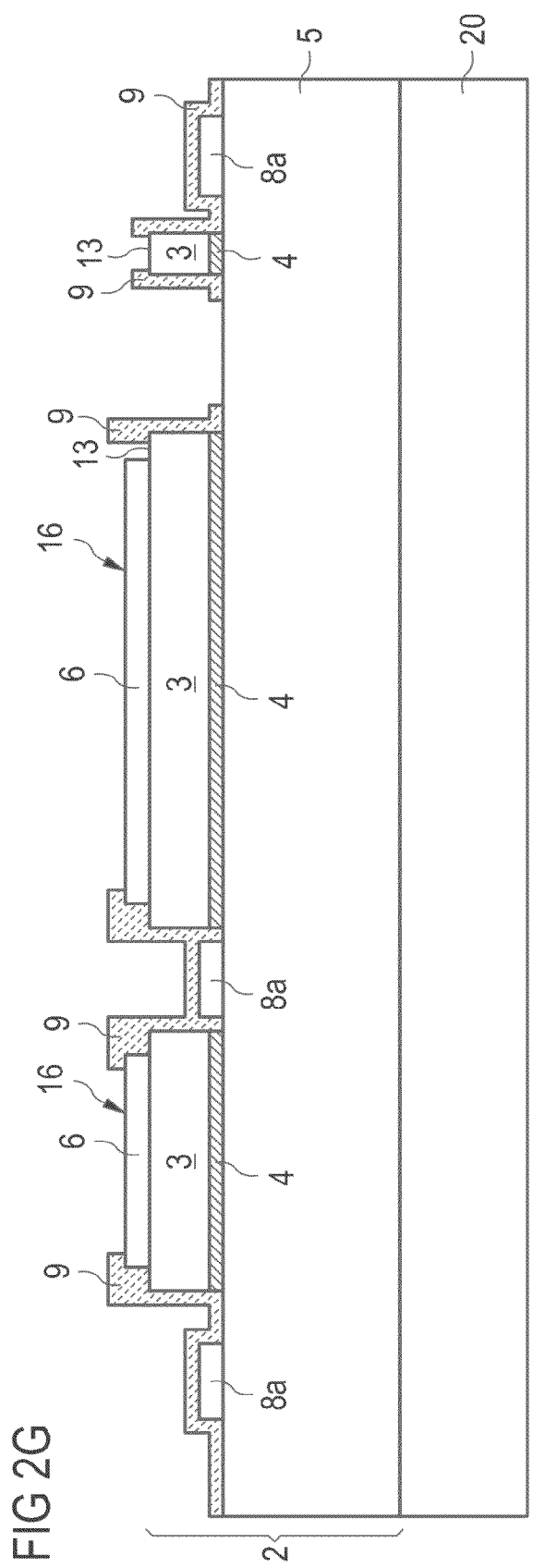

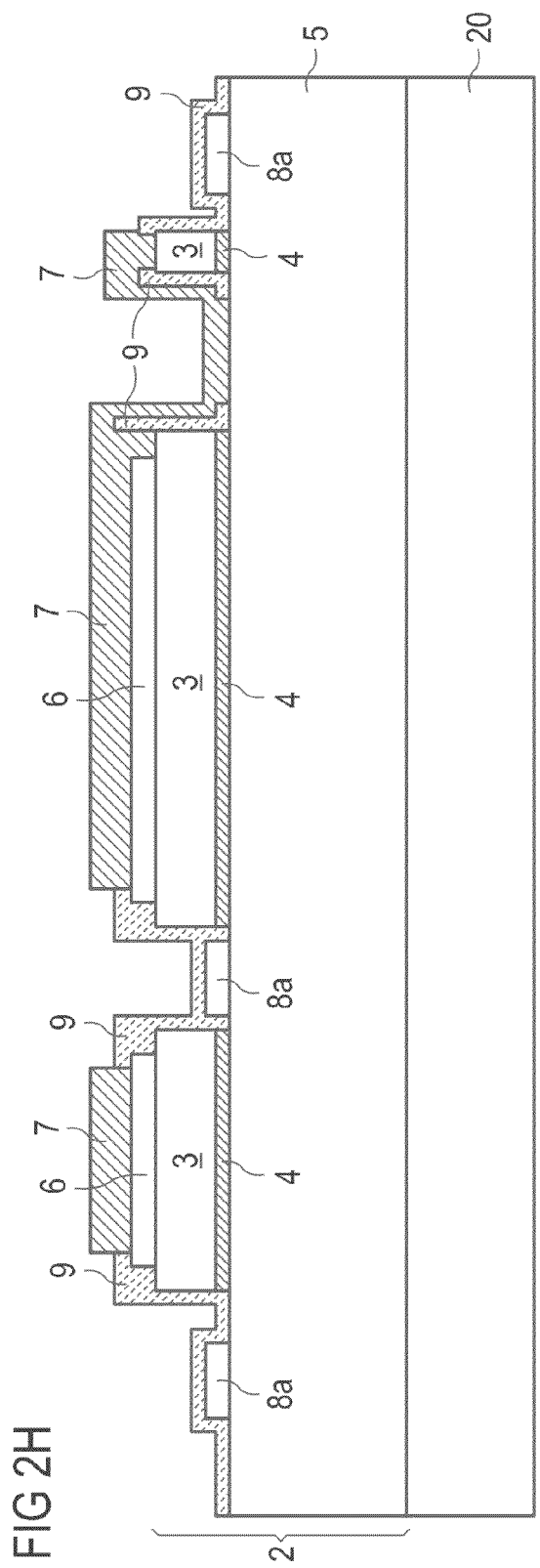

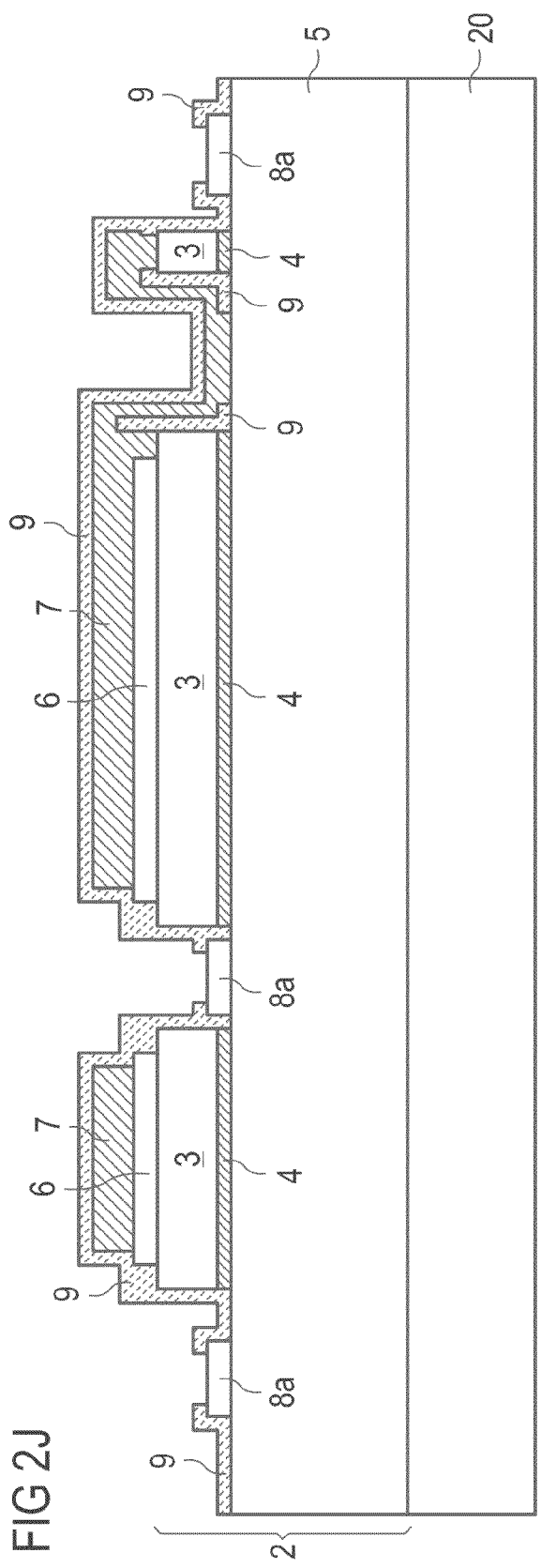

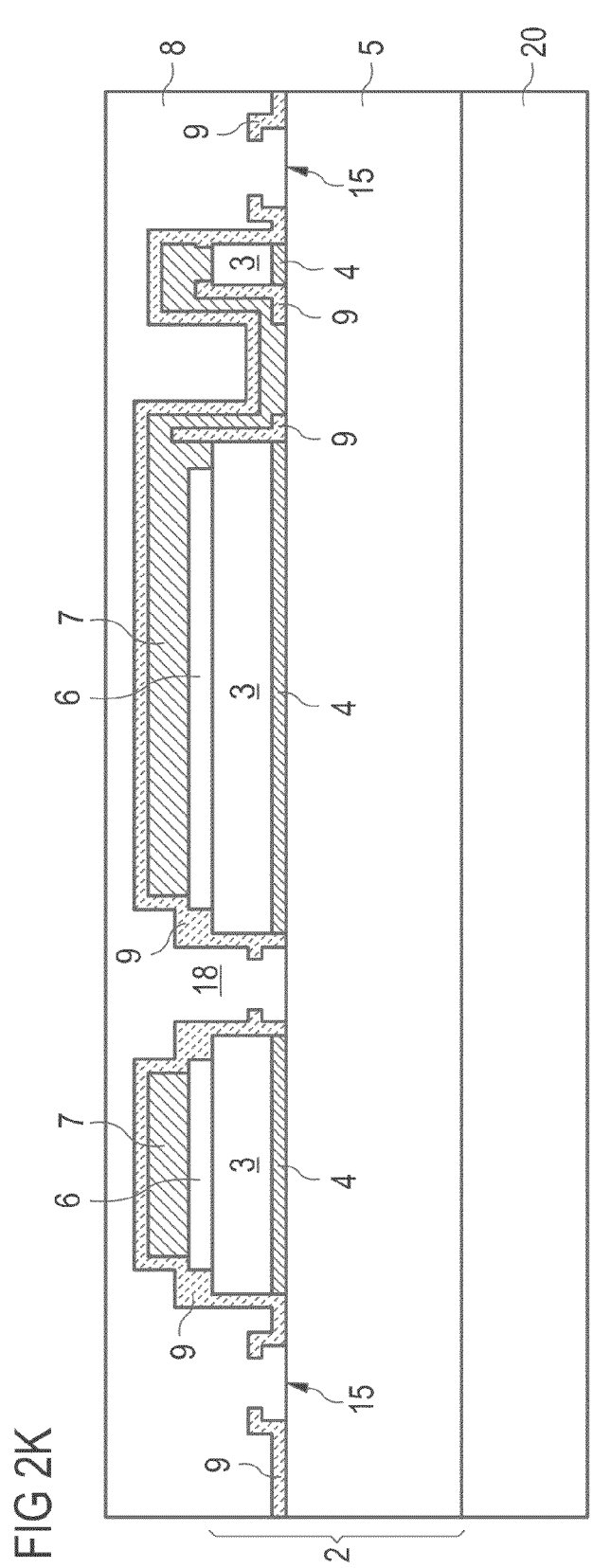

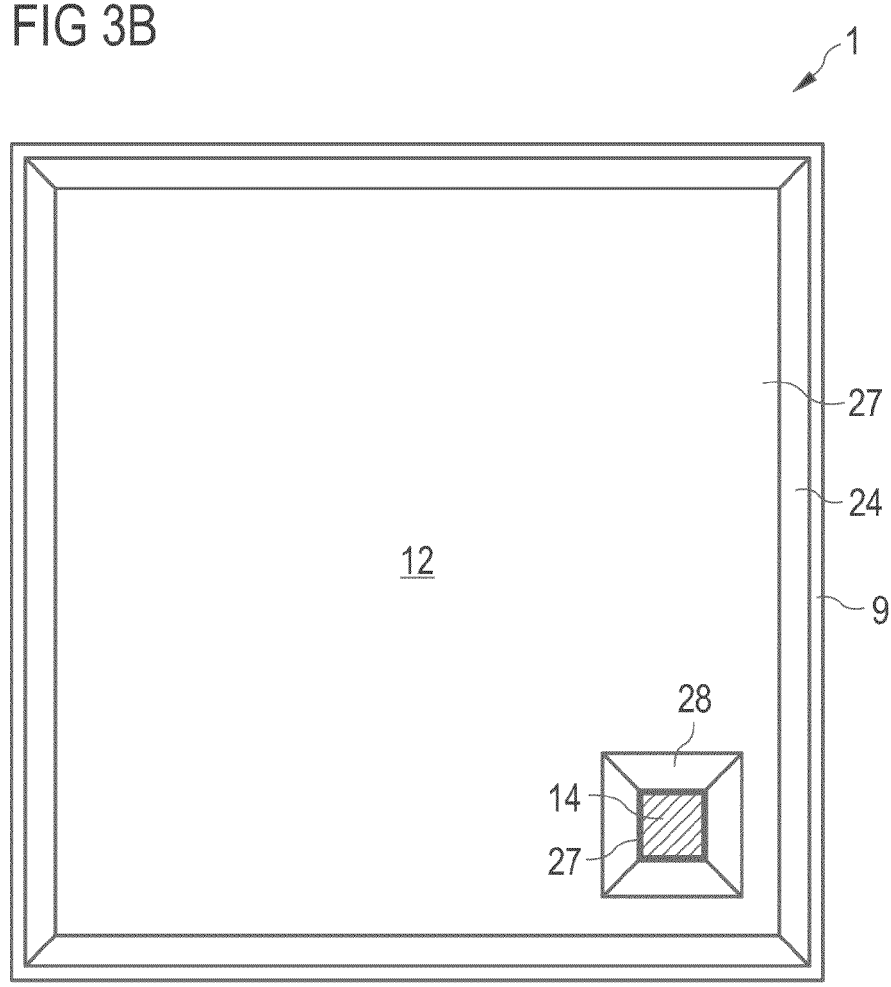

OPTOELECTRONIC SEMICONDUCTOR CHIP

This patent application is a national phase filing under section 371 of PCT/EP2011/064386, filed Aug. 22, 2011, which claims the priority of German patent application 10 2010 045 784.1, filed Sep. 17, 2010, each of which is incorporated herein by reference in its entirety.

TECHNICAL FIELD

The invention relates to an optoelectronic semiconductor chip.

BACKGROUND

International Patent Publication No. WO 2009/106069 A1 discloses an optoelectronic semiconductor chip wherein a first and a second electrical contact layer are arranged between the semiconductor layer sequence and the carrier substrate. In this case, the first and the second electrical contact layer are insulated from one another by means of an electrically insulating layer. In the case of a semiconductor chip of this type, a mirror layer, at a side facing the carrier substrate, can adjoin the semiconductor layer sequence in order to deflect the radiation emitted by the active zone in a direction of the carrier to a radiation coupling-out area lying opposite the carrier substrate.

In the case of a semiconductor chip of this type, there may be the risk of moisture being transported from the edges of the semiconductor chip through the electrically insulating layer right into the region of the minor layer, which would result in a degradation of the minor layer and, consequently, a reduction of the radiation efficiency.

SUMMARY OF THE INVENTION

In one aspect, the invention specifies an improved optoelectronic semiconductor chip wherein the mirror layer is effectively protected against the ingress of moisture and, at the same time, a very efficient electrical contact-connection of the semiconductor chip is obtained with comparatively little production outlay.

In accordance with one configuration, the optoelectronic semiconductor chip comprises a semiconductor layer sequence having a first semiconductor region of a first conduction type, a second semiconductor region of a second conduction type and an active zone arranged between the first and the second semiconductor region.

Furthermore, the optoelectronic semiconductor chip comprises a carrier substrate, wherein the semiconductor layer sequence has a first main area facing the carrier substrate and a second main area lying opposite. A first electrical contact layer and a second electrical contact layer are arranged at least in regions between the carrier substrate and the first main area of the semiconductor layer sequence, wherein the second electrical contact layer is led through a breakthrough in the first semiconductor region and the active zone into the semiconductor region. The first and the second electrical contact layer are insulated from one another by an electrically insulating layer.

A mirror layer is arranged between the semiconductor layer sequence and the carrier substrate. The minor layer, in particular at the first main area, can adjoin the semiconductor layer sequence. The minor layer advantageously reflects radiation emitted by the active zone in a direction of the carrier substrate to the second main area of the semiconductor layer sequence, the second main area serving as a radiation coupling-out area.

The minor layer adjoins partial regions of the first electrical contact layer and partial regions of the electrically insulating layer, wherein the predominant part of the interface of the minor layer that faces the carrier substrate is covered by the first electrical contact layer.

The partial regions of the electrically insulating layer which adjoin the minor layer are advantageously covered by the second electrical contact layer in such a way that at no point do they adjoin a surrounding medium of the optoelectronic semiconductor chip.

The semiconductor layer sequence preferably has a cutout, in which the first electrical contact layer is uncovered in order to form a connection contact.

By virtue of the fact that the predominant part of the interface of the minor layer that faces the carrier substrate is covered by the first electrical contact layer, the predominate part of the mirror layer is separated from the electrically insulating layer and thus protected against moisture that could penetrate into the electrically insulating layer from the side flanks of the semiconductor chip. A possible degradation of the mirror layer is advantageously reduced in this way.

By virtue of the fact that the partial regions of the electrically insulating layer which adjoin the minor layer are covered by the second electrical contact layer in such a way that at no point do they adjoin a surrounding medium of the optoelectronic semiconductor chip, at no point is the mirror layer in contact with a partial region of the electrically insulating layer that extends as far as the side flanks of the semiconductor chip. Therefore, the mirror layer is hermetically encapsulated by the first electrical contact layer and the second electrical contact layer and protected against the ingress of moisture.

The first and the second electrical contact layer advantageously serve firstly for the electrical contact-connection of the semiconductor chip and secondly for protecting the mirror layer against corrosion. In particular, the first electrical contact layer forms a connection contact arranged in a cutout in the semiconductor layer sequence. In the cutout, the semiconductor layer sequence is removed as far as the first electrical contact layer, such that the first electrical contact layer can be externally contact-connected there. In particular, the connection contact can form a bonding pad that can be connected to a bonding wire.

The first electrical contact layer preferably contains gold, titanium, chromium, titanium nitride, titanium tungsten nitride or nickel or consists thereof. These materials are advantageously distinguished firstly by a good electrical conductivity and secondly by their suitability as a diffusion barrier.

The minor layer preferably contains silver, aluminum or a silver or aluminum alloy or consists of one or more of these materials. Silver and aluminum are distinguished by high reflection in the visible spectral range. Furthermore, these materials have a good electrical conductivity and form a metal-semiconductor contact having a low contact resistance. This is advantageous since the mirror layer advantageously adjoins the semiconductor layer sequence and in this way electrically conductively connects the first semiconductor region to the first electrical contact layer.

Like the mirror layer, the second electrical contact layer preferably contains silver, aluminum or a silver or aluminum alloy, or consists of one or more of these materials. High reflection in the visible spectral range and a good electrical conductivity are advantageous for the second electrical contact layer since the second electrical contact layer also adjoins the semiconductor layer sequence at least in regions and in this way makes electrical contact with the second semiconductor region.

The electrically insulating layer, which insulates the first electrical contact layer and the second electrical contact layer from one another, preferably contains a silicon oxide, a silicon nitride, a silicon oxynitride or an aluminum oxide.

In one advantageous configuration, the first electrical contact layer directly adjoins a partial region of the first semiconductor region of the semiconductor layer sequence that is arranged alongside the connection contact. In this configuration, therefore, the first electrical contact layer is not only connected via the minor layer to the semiconductor layer sequence, but at least partly also directly adjoins the semiconductor layer sequence. In particular, the first electrical contact layer can form, around the connection contact, a circumferentially extending contact with the semiconductor layer sequence. The partial region of the first semiconductor region that is directly adjoined by the first electrical contact layer can surround the connection contact for example in a ring-shaped fashion or in the form of a rectangle or square.

In a further advantageous configuration, at least one partial region of the second semiconductor region laterally projects beyond the first semiconductor region. The second semiconductor region therefore preferably has a larger lateral extent than the first semiconductor region of the semiconductor layer sequence. The at least one partial region of the second semiconductor region that laterally projects beyond the first semiconductor region is preferably adjacent to the side flanks of the semiconductor chip.

The second electrical contact layer preferably at least partly directly adjoins the second semiconductor region in the region in which the second semiconductor region laterally projects beyond the first semiconductor region. This has the advantage that the second electrical contact layer makes contact with the second semiconductor region not only in the breakthrough through which it is led through the first semiconductor region and the active zone into the second semiconductor region, but also in the regions in which the second semiconductor region laterally projects beyond the first semiconductor region.

In particular, the second electrical contact layer can form a circumferentially extending contact to the second region of the semiconductor layer sequence. In this case, a "circumferentially extending" contact is understood to be a contact which is led completely around the first semiconductor region in that it surrounds the latter for example in a ring-shaped or rectangular fashion.

In one preferred configuration, the connection contact is arranged outside the center of the semiconductor chip. In particular, the midpoint of the connection contact is further away from the midpoint of the semiconductor layer sequence than from at least one side flank of the semiconductor layer sequence. The connection contact is particularly advantageously arranged in the vicinity of a corner of the semiconductor chip, wherein the midpoint of the connection contact is advantageously at a smaller distance from at least two side flanks of the semiconductor chip than from the midpoint of the semiconductor chip. By virtue of the arrangement of the connection contact in an edge region or particularly preferably in the vicinity of a corner of the semiconductor layer sequence, the central region of the semiconductor chip is advantageously not shaded by the connection contact and, consequently, the efficiency of the semiconductor chip is increased.

In one preferred configuration, the connection contact does not directly adjoin a side flank or corner of the semiconductor layer sequence, but rather is surrounded in a lateral direction on all sides by a part of the semiconductor layer sequence. This has the advantage of enabling a direct contact between the first electrical contact layer and the first region of the semiconductor layer sequence, the direct contact extending circumferentially around the connection contact. A good impression of current in the semiconductor chip is obtained in this way.

In one preferred embodiment, the first semiconductor region is a p-type semiconductor region and the second semiconductor region is an n-type semiconductor region. In this configuration, therefore, the minor layer adjoins the p-type semiconductor region, and the second electrical contact layer is led through the breakthrough into the n-type semiconductor region. The p-type semiconductor region faces the carrier substrate and the n-type semiconductor region faces the second main area of the semiconductor layer sequence, the second area serving as a radiation exit area.

That surface of the second semiconductor region which lies opposite the carrier substrate is preferably free of connection contacts. This has the advantage that radiation can be coupled out through the entire region of the surface of the second main area of the semiconductor layer sequence, apart from the connection contact in the cutout in the semiconductor layer sequence. In particular, the second main area of the semiconductor layer sequence can be provided with a roughening or a coupling-out structure in order to further improve the coupling-out of radiation.

In a further advantageous configuration, the semiconductor layer sequence of the optoelectronic semiconductor chip has no growth substrate. In this case, the semiconductor chip is a so-called thin-film light emitting diode chip, wherein the growth substrate used for the epitaxial growth of the semiconductor layer sequence has been stripped away after the connection of the semiconductor layer sequence to the carrier substrate.

The semiconductor chip is preferably connected to the carrier substrate by means of a solder layer. In particular, the semiconductor chip can be connected to the carrier substrate at the side lying opposite the original growth substrate.

BRIEF DESCRIPTION OF THE DRAWINGS

The invention is explained in greater detail below on the basis of the exemplary embodiments in association with FIGS. 1 to 3.

FIG. 1A shows a schematic illustration of a cross section through an optoelectronic semiconductor chip in accordance with one exemplary embodiment;

FIG. 1B shows a schematic illustration of a plan view of the optoelectronic semiconductor chip illustrated in FIG. 1A;

FIGS. 2A to 2M show a schematic illustration of a method for producing the optoelectronic semiconductor chip illustrated in FIGS. 1A and 1B on the basis of intermediate steps;

FIG. 3B shows a schematic illustration of a plan view of the optoelectronic semiconductor chip illustrated in FIG. 3A.

Identical or identically acting constituent parts are provided with the same reference symbols in each case in the Figures. The constituent parts illustrated and also the size relationships of the constituent parts among one anther should not be regarded as true to scale.

DETAILED DESCRIPTION OF ILLUSTRATIVE EMBODIMENTS

Figure 2B:
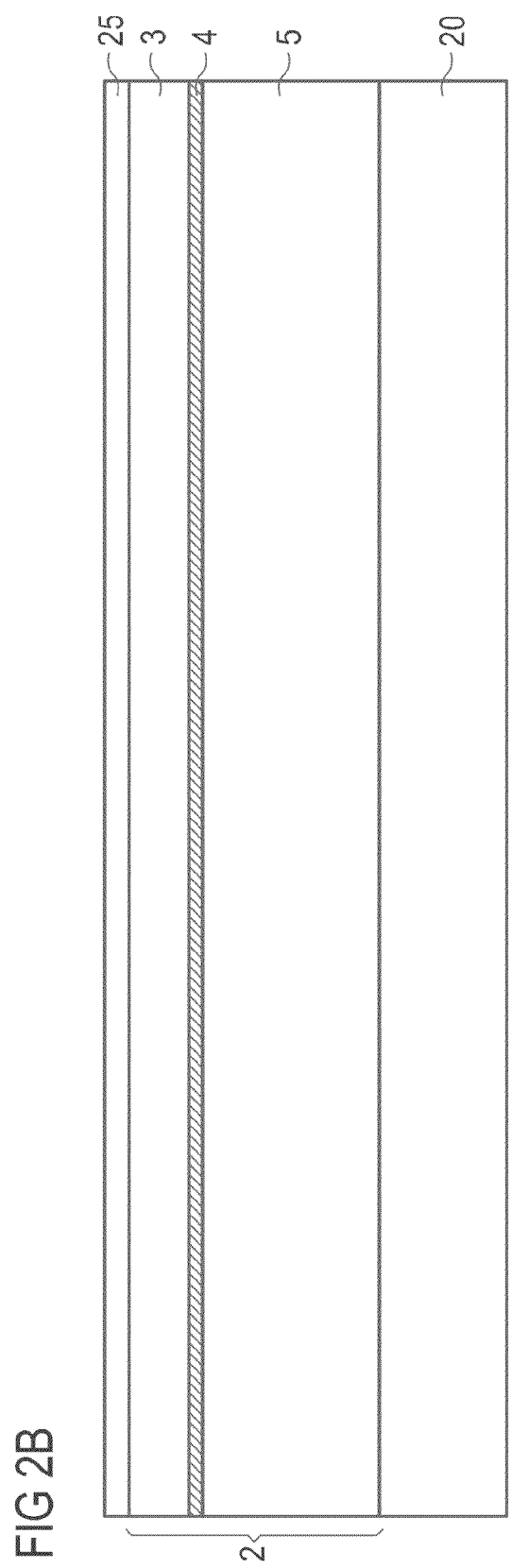

The optoelectronic semiconductor chip 1 illustrated in cross section in FIG. 1A and in a plan view in FIG. 1B contains a semiconductor layer sequence 2 having a first semiconductor region 3 of a first conduction type and a second semiconductor region 5 of a second conduction type. Preferably, the first semiconductor region 3 is a p-type semiconductor region and the second semiconductor region 5 is an n-type semiconductor region. An active zone 4 is arranged between the first semiconductor region 3 and the second semiconductor region 5.

The active zone 4 of the optoelectronic semiconductor chip 1 can be, in particular, an active zone suitable for emitting radiation. In this case, the optoelectronic semiconductor chip 1 is a luminescence diode, in particular an LED. Alternatively, it would also be conceivable for the active zone 4 to be a radiation-detecting layer, wherein the optoelectronic semiconductor chip 1 in this case is a detector component. The active zone 4 can be embodied, for example, as a pn junction, as a double heterostructure, as a single quantum well structure or multiple quantum well structure.

The semiconductor layer sequence 2 of the semiconductor chip 1 is preferably based on a III-V compound semiconductor material, in particular on an arsenide, nitride or phosphide compound semiconductor material. By way of example, the semiconductor layer sequence 2 can contain $In_xAl_yGa_{1-x-y}N$, $In_xAl_yGa_{1-x-y}P$ or $In_xAl_yGa_{1-x-y}As$, in each case where $0 \leq x \leq 1$, $0 \leq y \leq 1$ and $x+y \leq 1$. In this case, the III-V compound semiconductor material need not necessarily have a mathematically exact composition according to one of the above formulae. Rather, it can comprise one or a plurality of dopants and additional constituents which substantially do not change the physical properties of the material. For the sake of simplicity, however, the above formulae only include the essential constituents of the crystal lattice, even if these can be replaced in part by small amounts of further substances.

The semiconductor chip 1 is connected to a carrier substrate 10 by a connecting layer 21, which can be, in particular, a solder layer composed of a metal or a metal alloy.

For electrical contact-connection, the semiconductor chip 1 has a first electrical contact layer 7 and a second electrical contact layer 8. The first electrical contact layer 7 is electrically conductively connected to the first semiconductor region 3 and the second electrical contact layer 8 is electrically conductively connected to the second semiconductor region 5.

Both the first electrical contact layer 7 and the second electrical contact layer 8 are arranged at least in regions between a first main area 11 of the semiconductor layer sequence 2, the first main area facing the carrier substrate 10, and the carrier substrate 10. The first electrical contact layer 7 and the second electrical contact layer 8 are electrically insulated from one another by means of an electrically insulating layer 9. The electrically insulating layer 9 preferably contains a silicon oxide, a silicon nitride, a silicon oxynitride, an aluminum oxide or consists of one or more of these materials. Alternatively, the electrically insulating layer 9 can also contain other oxides or nitrides.

The second main area 12 of the semiconductor layer sequence 2, the second main area lying opposite the carrier substrate 10, serves as a radiation coupling-out area of the optoelectronic semiconductor chip 1 and is advantageously free of electrical contact layers. In order to improve the coupling-out of radiation, the second main area 12 can be provided with a coupling-out structure 23 or a roughening.

In order to improve the radiation efficiency of the optoelectronic semiconductor chip, a mirror layer 6 is arranged between the semiconductor layer sequence 2 and the carrier substrate 10. The mirror layer 6 is disposed downstream of the first semiconductor region 3 at the side facing the carrier substrate 10 and can adjoin, in particular, the first main area 11 of the semiconductor layer sequence 2. It is also possible for an intermediate layer, for example a thin adhesion promoter layer, to be arranged between the first semiconductor region 3 and the mirror layer 6. The mirror layer 6 contains, in particular, silver, aluminum or a metal alloy comprising silver or aluminum. These materials are distinguished by a high reflectivity in the visible spectral range and a good electrical conductivity. First, minor layer 6 has the function of reflecting radiation emitted by the active zone 4 in a direction of the carrier substrate 10 to the radiation coupling-out area 12. Furthermore, the minor layer 6 also serves for the electrical contact-connection of the first semiconductor region 3. In particular, the minor layer 6, at the side facing the carrier substrate 10, adjoins the first electrical contact layer 7 and is, therefore, electrically conductively connected to the first electrical contact layer 7.

The first electrical contact layer 7 preferably covers the predominant part of the interface 16 of the minor layer that faces the carrier substrate 10. The first electrical contact layer 7 preferably contains gold, titanium, chromium, titanium nitride, titanium tungsten nitride or nickel or consists of one or more of these materials. These materials are distinguished by the fact that they are electrically conductive and additionally chemically inert. In this way, the minor layer 6 is advantageously protected against corrosion in the regions in which it is covered by the first electrical contact layer 7.

The minor layer 6 furthermore adjoins partial regions 19 of the electrically insulating layer 9, which insulates the first electrical contact layer 7 and the second electrical contact layer 8 from one another. The partial regions 19 of the electrically insulating layer 9 which adjoin the mirror layer 6 are advantageously covered by the second electrical contact layer 8 in such a way that at no point do they adjoin a surrounding medium of the optoelectronic semiconductor chip 1. The partial regions 19 of the electrically insulating layer 9 which adjoin the mirror layer 6 are hermetically encapsulated in this way, such that, in particular, no moisture can pass from the side flanks of the semiconductor chip 1 through the electrically insulating layer 9 to the mirror layer 6. Corrosion of the moisture-sensitive minor layer 6 is prevented in this way.

The semiconductor layer sequence 2 has a cutout 17, in which the semiconductor layer sequence 2 is removed as far as the first electrical contact layer 7. Consequently, the first electrical contact layer 7 forms an externally accessible connection contact 14 arranged in the cutout 17. The connection contact 14 can be, in particular, a bonding pad provided for the connection of a bonding wire. The cutout 17 can be produced by means of an etching method and have, for example, oblique side flanks 28.

The second electrical contact layer 8 can be electrically connected externally for example via the rear side of the semiconductor chip 1, in particular via an electrically conductive carrier substrate 10 and the solder layer 21. A barrier layer 22 can be arranged between the solder layer 21 and the second electrical contact layer 8, the barrier layer preventing, in particular, diffusion of constituents of the solder layer 21 into the second electrical contact layer 8, and vice versa.

The second electrical contact layer 8 is electrically conductively connected to the second semiconductor region 5 through a breakthrough 18 running through the first semiconductor region 3 and the active zone 4. In the region of the breakthrough 18, the active zone 4, the first semiconductor region 3, the mirror layer 6 and the first electrical contact layer 7 are insulated from the second electrical contact layer 8 by means of the electrically insulating layer 9.

Advantageously, a partial region 15 of the second semiconductor region 5 projects beyond the first semiconductor region 3 in a lateral direction. The partial region 15 in which the second semiconductor region 5 laterally projects beyond the first semiconductor region 3 is preferably adjacent to the side flanks of the semiconductor chip 1. Preferably, the second electrical contact layer 8 at least in regions directly adjoins the second semiconductor region 5 in the partial region 15 in which the second semiconductor region 5 laterally projects beyond the first semiconductor region 3. In particular, in this way the second electrical contact layer 8 produces a direct contact to the second semiconductor region 5, the direct contact extending circumferentially at the edge of the semiconductor chip 1. An electrically conductive connection between the second electrical contact layer 8 and the second semiconductor region 5 therefore exists firstly in the region of the breakthrough 18 and secondly in the partial regions 15 in which the second semiconductor region 5 laterally projects beyond the first semiconductor region 3. Particularly effective impression of current into the semiconductor chip 1 is obtained in this way.

The second electrical connection layer 8, in the regions in which it directly adjoins partial regions 15 of the second semiconductor region 5, advantageously functions not only as a contact layer but also as a reflective layer that reflects part of the radiation emitted in a direction of the carrier substrate 10 towards the second main area 12 of the semiconductor layer sequence 2, the second main area serving as a radiation exit area. The second electrical connection layer therefore advantageously comprises a metal or a metal alloy having a high reflectivity, in particular silver, aluminum or an alloy comprising silver or aluminum.

Furthermore, it is advantageous if the first electrical contact layer 7 also directly adjoins the first semiconductor region 3 at least in regions. This can be realized, in particular, by virtue of the fact that the mirror layer 6 does not cover the entire interface of the first semiconductor region 3 which faces the carrier substrate 10, rather the mirror layer 6 is omitted from at least one partial region 13 of the first semiconductor region 3. In the partial region 13 of the first semiconductor region 3 that is not covered by the minor layer, the first electrical contact layer 7 directly adjoins the first semiconductor region 3. Preferably, the partial region 13 of the first semiconductor region 3 that directly adjoins the first electrical contact layer 7 is arranged alongside the connection contact 14. Particularly effective impression of current from the connection contact 14 into the first semiconductor region 3 is obtained in this way.

The partial region 13 in which the first electrical contact layer 7 directly adjoins the first semiconductor region 3 can be, in particular, a region extending circumferentially around the connection contact 14, that is to say that the partial region 13 can be led around the connection contact 14 in particular in a ring- or frame-shaped fashion.

The connection contact 14 is preferably arranged outside the center of the semiconductor chip 1. As can be seen in the plan view in FIG. 1B, the connection contact 14 is preferably arranged in the vicinity of a corner of the semiconductor chip 1.

It is advantageous if the connection contact 14 does not directly adjoin a side flank 24 of the semiconductor layer sequence 2. Preferably, the connection contact 14, as seen in a lateral direction, is surrounded on all sides by a part of the semiconductor layer sequence 2. This makes it possible for the contact between the first electrical contact layer 7 and partial regions 13 of the first semiconductor region 3 to be embodied in the manner extending circumferentially around the connection contact 14, in order to obtain particularly effective impression of current into the first semiconductor region 3.

An exemplary embodiment of a method for producing the optoelectronic semiconductor chip is described in the following FIGS. 2A to 2M. The above-described advantageous configurations of individual constituent parts of the optoelectronic semiconductor chip apply in the same way to the method described below and vice versa.

In the intermediate step of the method as illustrated in FIG. 2A, the semiconductor layer sequence 2 comprising the first semiconductor region 3, the active zone 4 and the second semiconductor region 5 has been grown onto a growth substrate 20. The growth is preferably effected epitaxially, in particular by means of MOVPE. The semiconductor layer sequence 2 can contain nitride compound semiconductor materials, for example, and the growth substrate 20 can be a sapphire substrate. The first semiconductor region 3 is preferably a p-type semiconductor region and the second semiconductor region 5 is preferably an n-type semiconductor region.

In the method step illustrated in FIG. 2B an oxide layer 25, for example a silicon oxide layer, has been applied to the second semiconductor region 5. The oxide layer 25 serves for protecting the first semiconductor region 3 during subsequent photolithography and etching processes.

In the intermediate step illustrated in FIG. 2C, the semiconductor layer sequence 2 has been patterned photolithographically, in particular by means of reactive ion etching (RIE), wherein the semiconductor layer sequence 2 has been removed in partial regions right into the second semiconductor region 5, that is to say that the first semiconductor region 3 and the active zone 4 have been completely removed in these regions. The surface of the second semiconductor region 5 that has been uncovered in partial regions in this way can be treated by inductively coupled plasma etching (ICP) in order to prepare for applying a connection contact later.

In the method step illustrated in FIG. 2D, the previously applied oxide layer has been removed again, for example by etching by means of buffered hydrofluoric acid (BOE—Buffered Oxide Etch). Furthermore, a metallization 26 has been applied to the previously patterned semiconductor layer sequence 2, the metallization preferably containing silver or aluminum and forming regions of the mirror layer and of the second electrical contact layer in the finished semiconductor chip. Advantageously, a protective layer, for example, a Pt—Ti—Pt layer sequence (not illustrated), is applied to the silver- or aluminum-containing metallization 26.

Figure 2E:
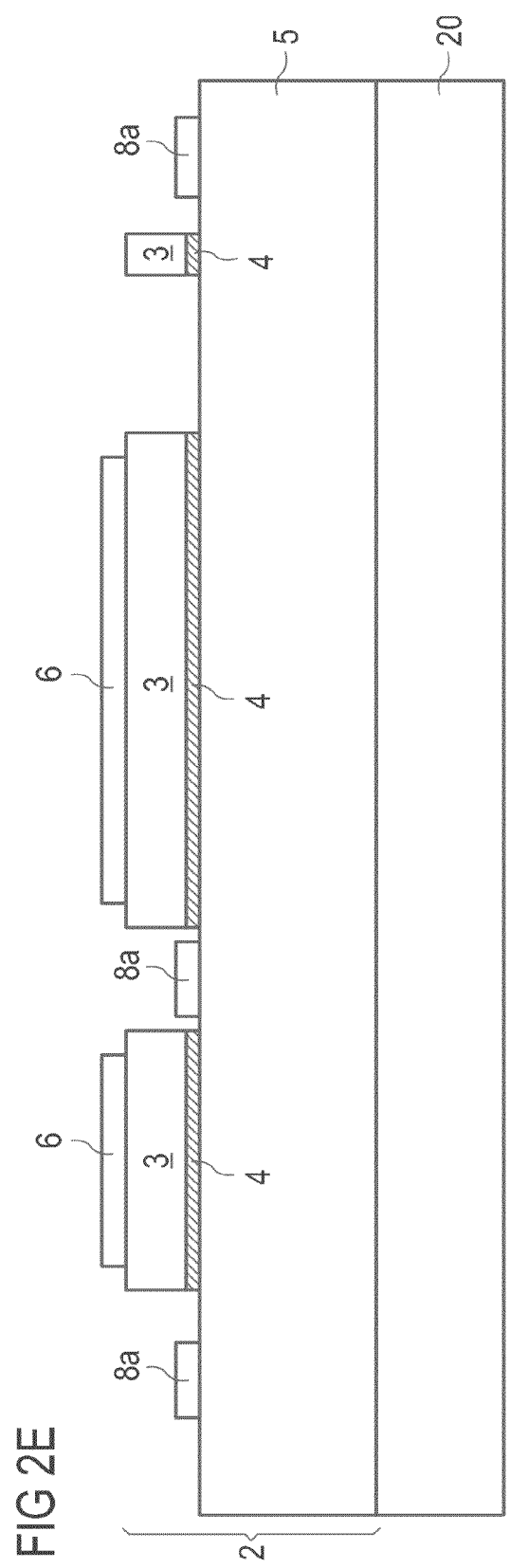

In the method step illustrated in FIG. 2E, the metallization 26 has been patterned in order to form separate contacts for the first semiconductor region 3 and the second semiconductor region 5, for example by means of photolithography. The partial regions of the metallization that are arranged on the first semiconductor region 3 after patterning form the minor layer 6 in the finished semiconductor chip. The regions 8a of the metallization that are arranged on the second semiconductor region 5 form parts of the second electrical contact layer in the finished semiconductor chip.

Figure 2F:
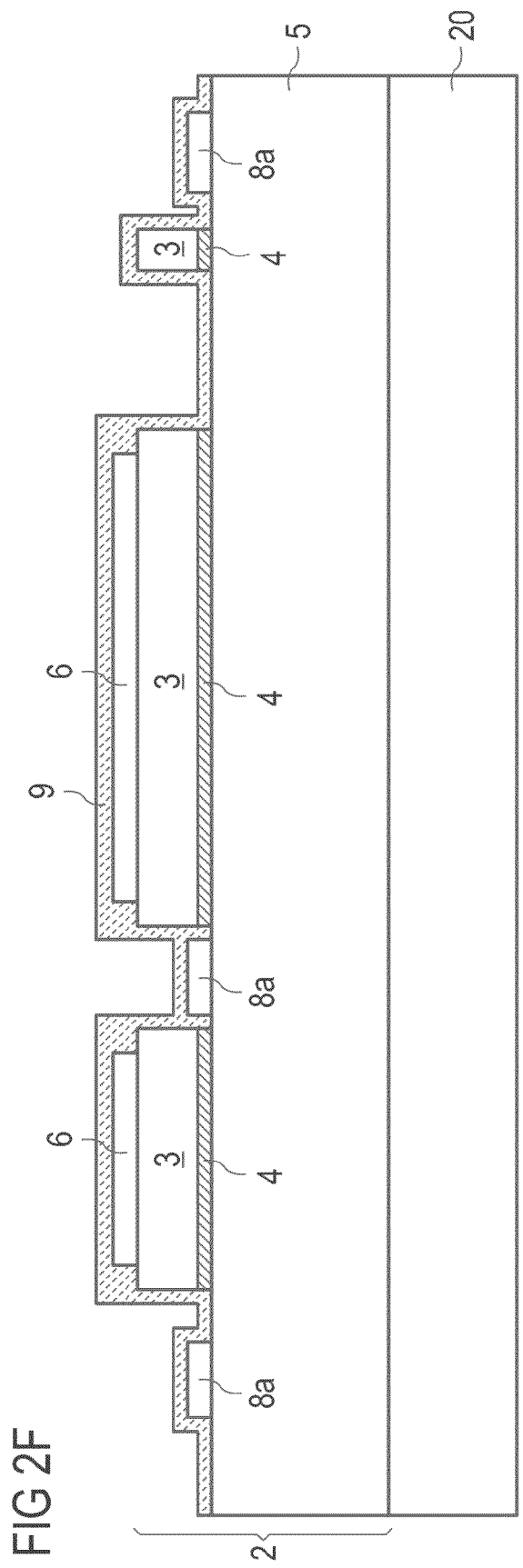

In the intermediate step illustrated in FIG. 2F, an electrically insulating layer 9 has been applied to the structure produced in this way. The electrically insulating layer 9 can be, in particular, a silicon oxide layer or a silicon nitride layer.

In the intermediate step illustrated in FIG. 2G, openings have been produced in the electrically insulating layer 9 in order to uncover the minor layer 6, in particular. The openings can be produced by means of photolithography, wherein, in particular, an etching step by means of BOE can be effected. This makes it possible that, in a later method step, a contact layer can be applied to the interface 16 of the mirror layer 6 that is remote from the semiconductor layer sequence 2. The electrically insulating layer 9 has been removed in regions as far as a partial region 13 of the first semiconductor region 3.

In the intermediate step illustrated in FIG. 2H, the first electrical contact layer 7 has been applied and patterned photolithographically. The first electrical contact layer 7 covers the surface of the mirror layer 6 and in this way firstly produces the electrical connection to the first semiconductor region 3, and secondly serves as an encapsulation for the material of the minor layer 6. The first electrical contact layer 7 can contain, in particular, gold, titanium, chromium, titanium nitride, titanium tungsten nitride or nickel or consist of one or more of these materials. It is also possible for the first electrical contact layer 7 to comprise a plurality of partial layers. By way of example, the first electrical contact layer 7 can comprise a titanium layer and a subsequent gold layer.

Figure 2I:
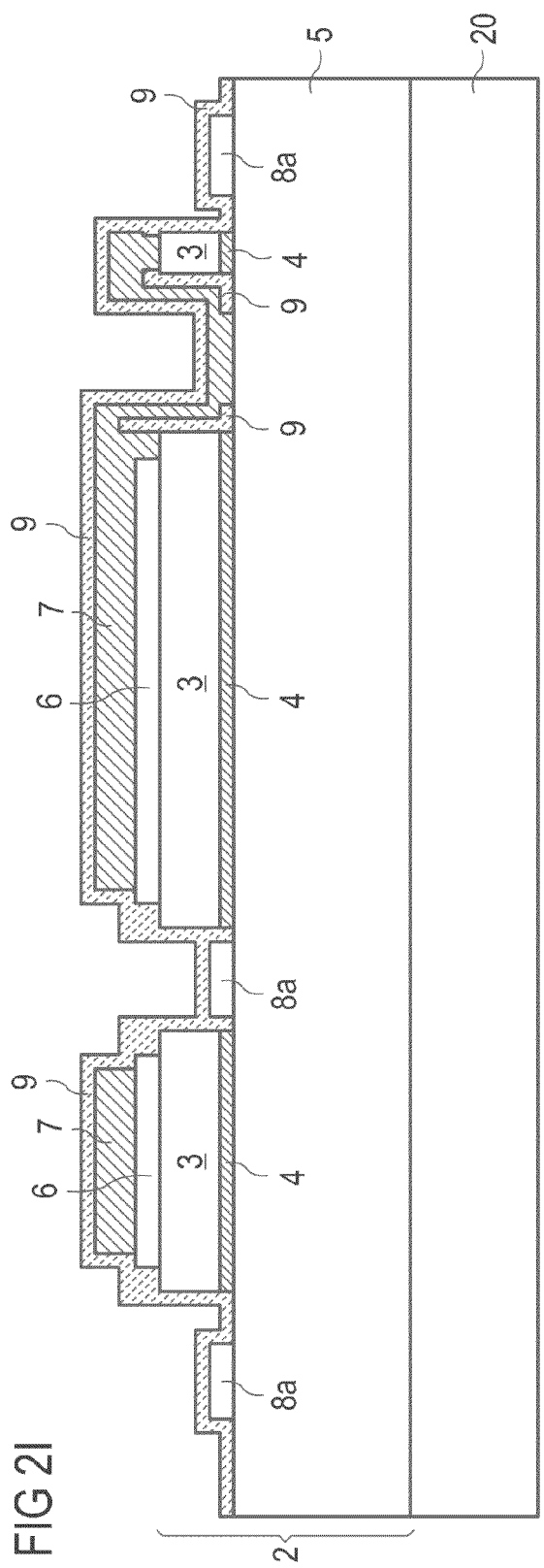

In the intermediate step illustrated in FIG. 2I, an electrically insulating layer 9 has been applied in order to insulate the previously applied first electrical contact layer 7.

In the intermediate step illustrated in FIG. 2J, openings have been produced in the electrically insulating layer 9 in order to uncover the previously applied partial regions 8a of the second electrical contact layer. This can be effected, for example, photolithographically in conjunction with a BOE etch.

In the intermediate step illustrated in FIG. 2K, the entire layer structure produced previously has been covered with the second electrical contact layer 8. The second electrical contact layer 8 preferably contains silver, aluminum or an alloy comprising silver or aluminum. The second electrical contact layer 8 serves for making electrical contact with the second semiconductor region 5, which can be, in particular, an n-type semiconductor region. In order to produce the contact with the second semiconductor region 5, the second electrical contact layer 8 firstly adjoins the second semiconductor region 5 in a breakthrough 18 running through the first semiconductor region 3 and the active zone 4. Furthermore, the second electrical contact layer 8 adjoins the second semiconductor region 5 in a partial region 15 of the second semiconductor region 5 that runs along the edge of the semiconductor chip 1. In particular, a contact between the second electrical contact layer 8 and the second semiconductor region 5, the contact extending completely circumferentially around an edge of the semiconductor chip 1, is realized in this way. Particularly efficient impression of current into the semiconductor chip 1 is obtained in this way.

Figure 2L:
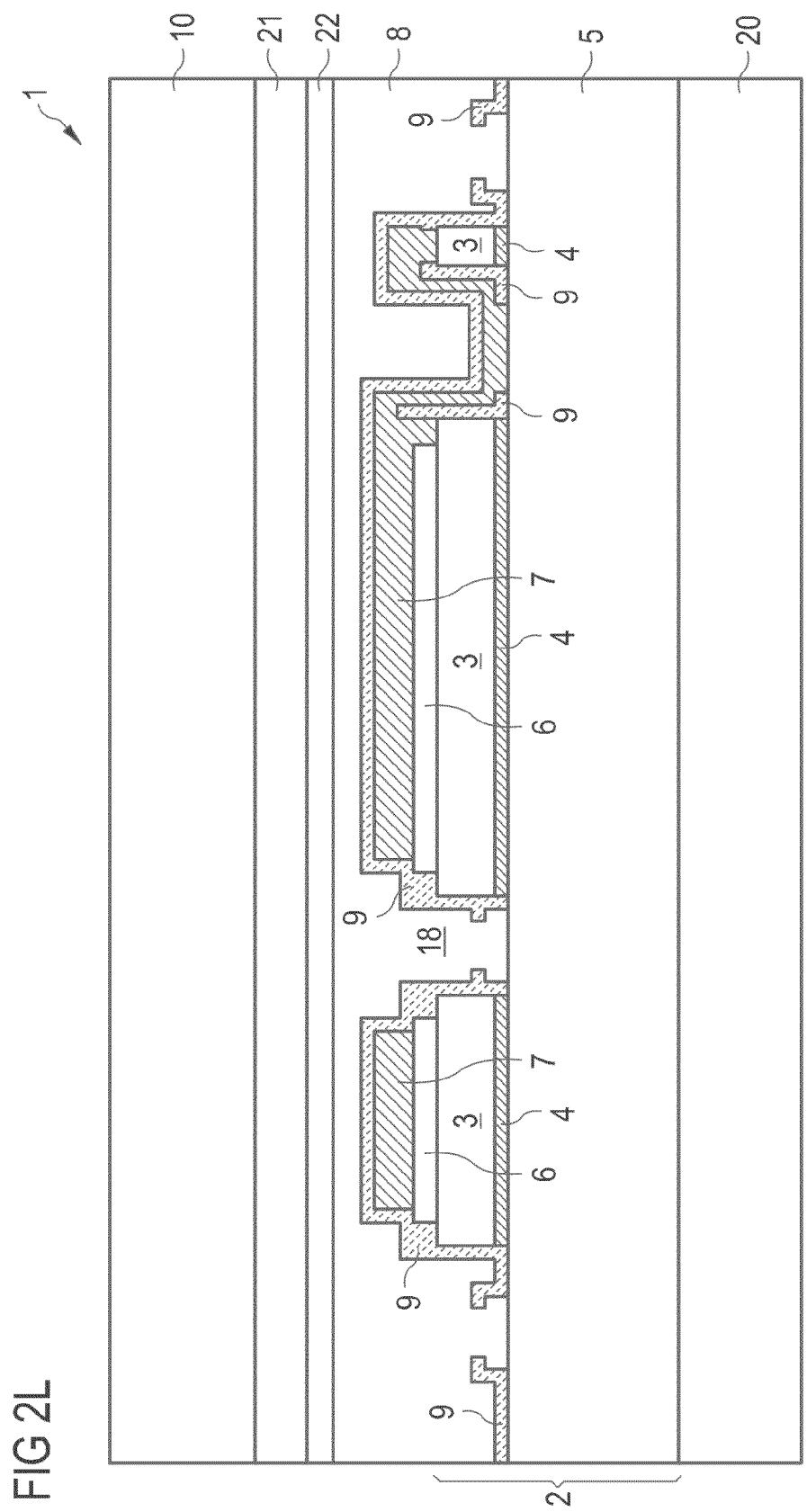

In the intermediate step illustrated in FIG. 2L, the semiconductor chip 1 has been connected to a carrier substrate 10 by means of a solder layer 21 at a side remote from the growth substrate 20. Before the carrier substrate 10 is connected to the semiconductor chip 1, a barrier layer 22 is preferably applied to the second electrical contact layer 8 in order to protect the preferably silver- or aluminum-containing second electrical contact layer 8 against diffusion of constituents of the solder layer 21. The solder layer 21 can contain AuSn, in particular. The barrier layer 22 can contain TiWN, for example.

The carrier substrate 10 is preferably an electrically conductive substrate, for example a doped semiconductor wafer composed of silicon or germanium.

Figure 2M:
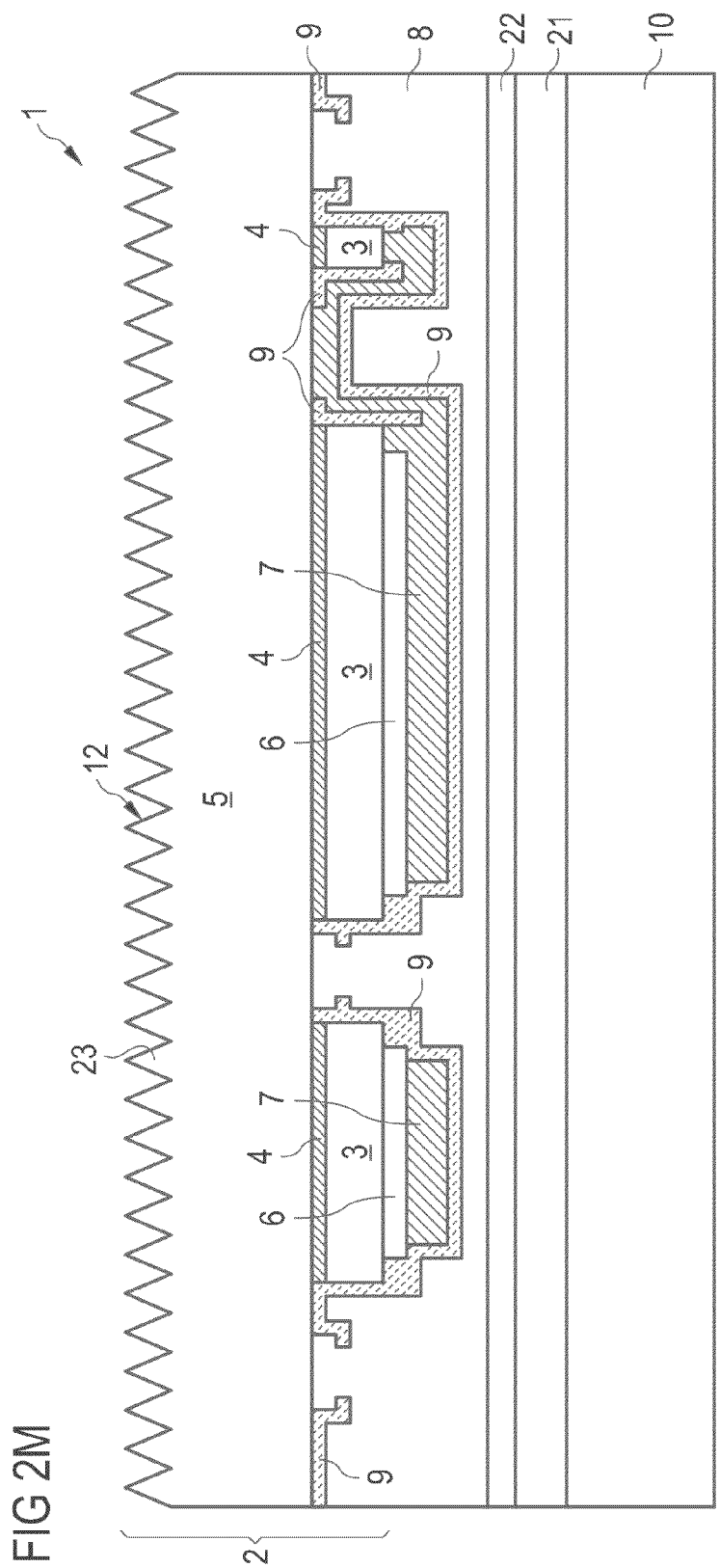

In the intermediate step illustrated in FIG. 2M, the growth substrate 20 has been stripped away from the semiconductor chip 1. The semiconductor chip 1 is illustrated in a manner rotated by 180° in comparison with the previous figures, since now the carrier substrate 10 lying opposite the original growth substrate functions as sole carrier of the semiconductor chip 1. The growth substrate, in particular a sapphire substrate, can be stripped away from the semiconductor layer sequence 2 by means of a laser-lift-off process, for example. The main area 12 of the semiconductor chip 1 from which the growth substrate 20 has been stripped away has additionally been provided with a coupling-out structure 23, for example, by etching using KOH, in the intermediate step illustrated in FIG. 2M. This is advantageous since the second main area 12 of the semiconductor chip 1 serves as a radiation coupling-out area in the finished optoelectronic semiconductor chip 1.

In a further method step, as illustrated in FIG. 1A, the second semiconductor region 5 is provided with a mesa structure, such that the semiconductor chip 1 can have, in particular, oblique side flanks 24 in the second semiconductor region 5. Furthermore, a cutout 17 is produced in the second semiconductor region 5, in which cutout the second semiconductor region 5 is removed as far as the first electrical contact layer 7. The cutout 17 can have oblique side flanks 28. The mesa structure and the cutout 17 can be produced by means of a wet-chemical etching process or by means of dry etching. By virtue of the fact that the first electrical contact layer 7 is uncovered in the cutout 17, it forms there an externally accessible electrical connection contact 14, which can serve, in particular, as a bonding pad for producing a wire connection. A further electrical connection can be provided at the rear side of the preferably electrically conductive carrier substrate 10 in order to electrically connect the second electrical contact layer 8 in this way.

The exemplary embodiment of an optoelectronic semiconductor chip 1, as illustrated in FIG. 1A, was produced in this way.

Figure 3A:
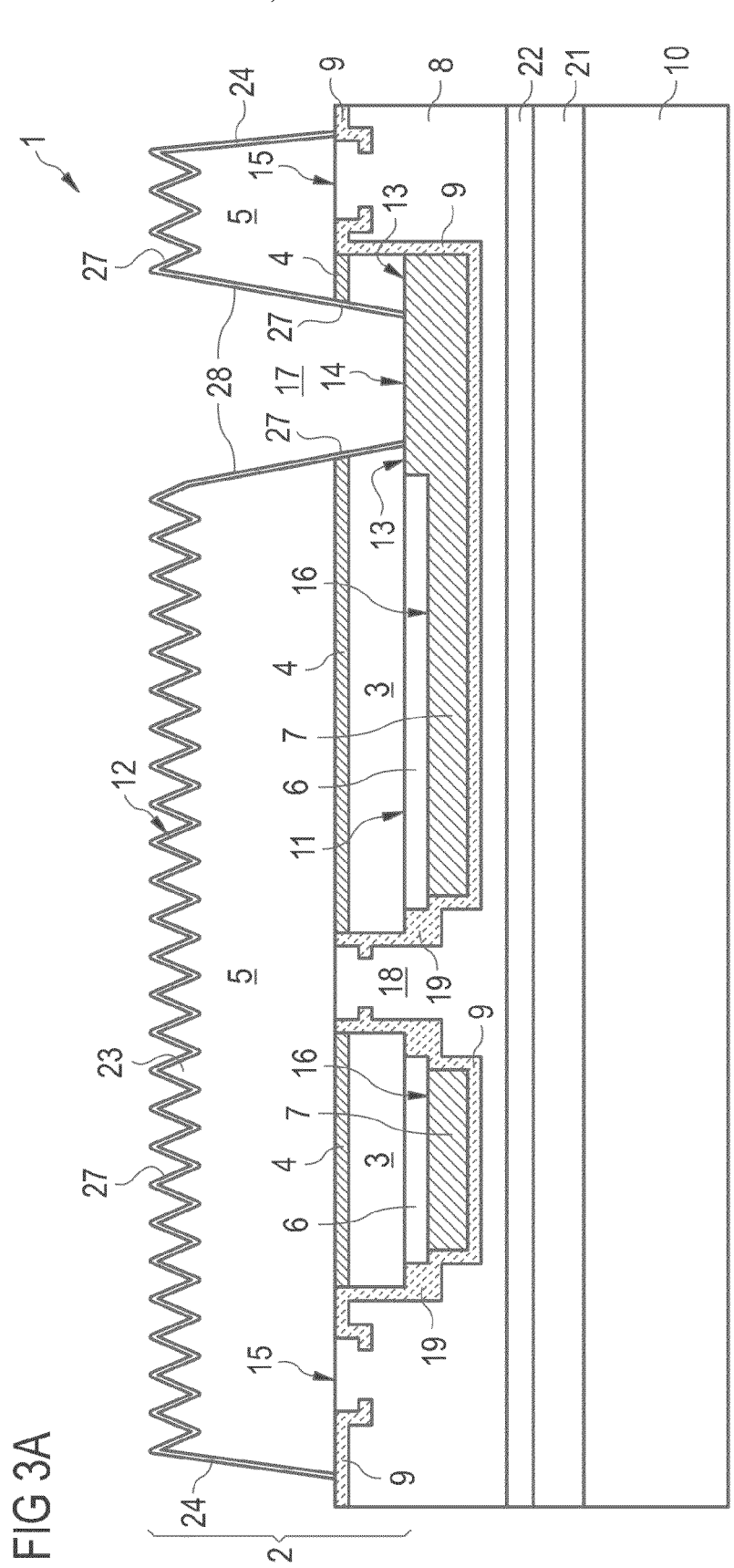
FIG. 3A shows a schematic illustration of a cross section through an optoelectronic semiconductor chip in accordance with a further exemplary embodiment.

The second exemplary embodiment of an optoelectronic semiconductor chip as illustrated in a cross section in FIG. 3A and in a plan view in FIG. 3B differs from the first exemplary embodiment illustrated in FIG. 1A in that the cutout 17 in the semiconductor layer sequence 2 leads through the entire semiconductor layer sequence 2 as far as the first electrical contact layer 7. The connection contact 14 is therefore situated at the level of the original surface of the semiconductor layer sequence 2.

By comparison with the exemplary embodiment illustrated in FIG. 1A, the exemplary embodiment illustrated in FIG. 3A has the following advantage. In the exemplary embodiment illustrated in FIG. 1A, the first electrical contact layer 7 is shaped over the partial regions of the electrically insulating layer 9 which adjoin the edge region of the connection contact 14, and that region of the electrically insulating layer 9 which is in contact with the minor layer 6 in a partial region 19 is in turn shaped over the first electrical contact layer. If the electrical contact layer 7 is shaped only poorly over the steps formed by the regions of the electrically insulating layer 9 which adjoin the connection contact, there is the risk that these partial regions of the electrically insulating layer 9 will come into contact with the electrically insulating layer 9 arranged there-above and, in this way, there is the risk of moisture passing through the partial regions of the electrically insulating layer 9 which adjoin the surrounding medium as far as the minor layer 6.

This is avoided in the exemplary embodiment illustrated in FIG. 3A since no further electrically insulating layer in contact with the surrounding medium is shaped over the electrically insulating layer 9 in contact with the mirror layer 6. However, in the exemplary embodiment illustrated in FIG. 3A, a further electrically insulating layer 27 has to be applied at least to the side flanks 28 of the cutout 17 in order to protect the active zone 4 uncovered there. This additional electrically insulating layer 27 can be applied, for example, to the entire second main area 12 of the semiconductor chip 1 that is remote from the carrier substrate 10, with the exception of the connection contact 14.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip, comprising:
   a semiconductor layer sequence having a first semiconductor region of a first conduction type, a second semiconductor region of a second conduction type and an active zone arranged between the first and the second semiconductor regions;
   a carrier substrate, wherein the semiconductor layer sequence has a first main area facing the carrier substrate and a second main area lying opposite the first main area;
   a first electrical contact layer and a second electrical contact layer, which are arranged at least in regions between the carrier substrate and the first main area of the semiconductor layer sequence, wherein the second electrical contact layer is led through a breakthrough in the first semiconductor region and the active zone into the second semiconductor region;
   an electrically insulating layer that electrically insulates the first electrical contact layer and the second electrical contact layer from one another; and
   a mirror layer arranged between the semiconductor layer sequence and the carrier substrate;
   wherein the mirror layer adjoins partial regions of the first electrical contact layer and partial regions of the electrically insulating layer, wherein a predominant part of an interface of the mirror layer that faces the carrier substrate is covered by the first electrical contact layer;
   wherein the partial regions of the electrically insulating layer that adjoin the mirror layer are covered by the second electrical contact layer in such a way that at no point do they adjoin a surrounding medium of the optoelectronic semiconductor chip; and
   wherein the semiconductor layer sequence has a cut-out, in which the first electrical contact layer is uncovered in order to form a connection contact.

2. The optoelectronic semiconductor chip according to claim 1, wherein the first electrical contact layer contains gold, titanium, chromium, titanium nitride, titanium tungsten nitride or nickel.

3. The optoelectronic semiconductor chip according to claim 1, wherein the mirror layer contains silver, aluminium, a silver alloy or an aluminium alloy.

4. The optoelectronic semiconductor chip according to claim 1, wherein the second electrical contact layer contains silver, aluminium, a silver alloy or an aluminium alloy.

5. The optoelectronic semiconductor chip according to claim 1, wherein the electrically insulating layer contains a silicon oxide, a silicon nitride, a silicon oxynitride or an aluminium oxide.

6. The optoelectronic semiconductor chip according to claim 1, wherein the first electrical contact layer directly adjoins a partial region of the first semiconductor region that is arranged alongside the connection contact.

7. The optoelectronic semiconductor chip according to claim 1, wherein a partial region of the second semiconductor region laterally projects beyond the first semiconductor region.

8. The optoelectronic semiconductor chip according to claim 7, wherein the second electrical contact layer at least partly directly adjoins the second semiconductor region in the partial region in which the second semiconductor region laterally projects beyond the first semiconductor region.

9. The optoelectronic semiconductor chip according to claim 8, wherein the second electrical contact layer forms a circumferentially extending contact, that is led completely around the first semiconductor region to the second semiconductor region of the semiconductor layer sequence.

10. The optoelectronic semiconductor chip according to claim 1, wherein the connection contact is arranged outside a center of the semiconductor chip.

11. The optoelectronic semiconductor chip according to claim 1, wherein the connection contact, as seen in a lateral direction, is surrounded on all sides by a part of the semiconductor layer sequence.

12. The optoelectronic semiconductor chip according to claim 1, wherein the first semiconductor region is a p-type semiconductor region.

13. The optoelectronic semiconductor chip according to claim 1, wherein the second semiconductor region is an n-type semiconductor region.

14. The optoelectronic semiconductor chip according to claim 1, wherein the semiconductor layer sequence has no growth substrate.

15. The optoelectronic semiconductor chip according to claim 1, further comprising a solder layer between the second contact layer and the carrier substrate.

16. An optoelectronic semiconductor chip, comprising:
   a semiconductor layer sequence having a first semiconductor region of a first conduction type, a second semiconductor region of a second conduction type and an active zone arranged between the first and the second semiconductor region;
   a carrier substrate, wherein the semiconductor layer sequence has a first main area facing the carrier substrate and a second main area lying opposite the first main area;
   a first electrical contact layer and a second electrical contact layer, which are arranged at least in regions between the carrier substrate and the first main area of the semiconductor layer sequence, wherein the second electrical contact layer is led through a breakthrough in the first semiconductor region and the active zone into the second semiconductor region;
   an electrically insulating layer that electrically insulates the first electrical contact layer and the second electrical contact layer from one another; and
   a mirror layer arranged between the semiconductor layer sequence and the carrier substrate;
   wherein the mirror layer adjoins partial regions of the first electrical contact layer and partial regions of the electrically insulating layer, wherein a predominant part of an interface of the mirror layer that faces the carrier substrate is covered by the first electrical contact layer;

wherein the partial regions of the electrically insulating layer that adjoin the mirror layer are covered by the second electrical contact layer in such a way that at no point do they adjoin a surrounding medium of the opto-electronic semiconductor chip;

wherein the semiconductor layer sequence has a cut-out, in which the first electrical contact layer is uncovered in order to form a connection contact;

wherein a partial region of the second semiconductor region laterally projects beyond the first semiconductor region;

wherein the second electrical contact layer at least partly directly adjoins the second semiconductor region in the partial region in which the second semiconductor region laterally projects beyond the first semiconductor region; and wherein the second electrical contact layer forms a circumferentially extending contact that is led completely around the first semiconductor region to the second semiconductor region of the semiconductor layer sequence.

* * * * *